United States Patent
Son

(10) Patent No.: US 7,649,397 B2
(45) Date of Patent: Jan. 19, 2010

(54) INTERNAL VOLTAGE DETECTION CIRCUIT AND INTERNAL VOLTAGE GENERATION DEVICE USING THE SAME

(75) Inventor: Jong Ho Son, Icheon-si (KR)

(73) Assignee: Hynix Semiconductor Inc., Icheon-si (KR)

(*) Notice: Subject to any disclaimer, the term of this patent is extended or adjusted under 35 U.S.C. 154(b) by 148 days.

(21) Appl. No.: 11/824,974

(22) Filed: Jun. 29, 2007

(65) Prior Publication Data

US 2008/0198677 A1 Aug. 21, 2008

(30) Foreign Application Priority Data

Feb. 15, 2007 (KR) .................. 10-2007-0016184

(51) Int. Cl.
*G05F 1/575* (2006.01)
*G05F 1/567* (2006.01)

(52) U.S. Cl. ............... 327/321; 327/537; 327/541; 327/543

(58) Field of Classification Search ............... None
See application file for complete search history.

(56) References Cited

U.S. PATENT DOCUMENTS

| 6,208,197 | B1 | 3/2001 | Ternullo, Jr. et al. | |
|---|---|---|---|---|
| 6,314,028 | B1* | 11/2001 | Kono | 365/189.09 |
| 6,577,166 | B2* | 6/2003 | Lim | 327/77 |
| 7,095,269 | B2* | 8/2006 | Yamada | 327/537 |
| 7,266,031 | B2* | 9/2007 | Kim et al. | 365/211 |
| 7,298,199 | B2* | 11/2007 | Jung et al. | 327/536 |
| 7,366,048 | B2* | 4/2008 | Byeon | 365/226 |
| 2007/0047333 | A1* | 3/2007 | Noh et al. | 365/189.09 |
| 2007/0279123 | A1* | 12/2007 | Byeon et al. | 327/536 |
| 2008/0018377 | A1* | 1/2008 | Chung | 327/513 |

FOREIGN PATENT DOCUMENTS

KR 10-2006-0118733 A 11/2006

* cited by examiner

*Primary Examiner*—Lincoln Donovan
*Assistant Examiner*—Terry L Englund
(74) *Attorney, Agent, or Firm*—John P. White; Cooper & Dunham LLP

(57) ABSTRACT

An internal voltage detection circuit and an internal voltage generation device using the same are disclosed. The internal voltage detection circuit includes a first detect signal generator for generating a first detect signal to detect a level of an internal voltage corresponding to an operating temperature of a memory cell, a second detect signal generator for generating a second detect signal to detect a specific level of the internal voltage corresponding to a preset temperature, and a detect signal clamp unit for comparing a level of the first detect signal and a level of the second detect signal with each other and clamping the first detect signal according to a result of the comparison.

33 Claims, 8 Drawing Sheets

INTERNAL VOLTAGE DETECTION CIRCUIT AND INTERNAL VOLTAGE GENERATION DEVICE USING THE SAME

BACKGROUND

The present disclosure relates to an internal voltage detection circuit and an internal voltage generation device using the same, and more particularly to an internal voltage detection circuit for generating and supplying a pulse signal of a period varying with temperature in a self-refresh operation of a DRAM, and an internal voltage generation device using the same.

In general, a dynamic random access memory (DRAM) comprises a plurality of memory cells, each of which is composed of one cell transistor and one data storage capacitor. A read operation and a write operation are basically performed with respect to the memory cells of the DRAM, constructed in the above manner. First, the read operation will hereinafter be described in association with, as an example, the case where a high level (1.6V) is stored in a memory cell.

At the time that a word line is activated to a high voltage Vpp level, a cell transistor is turned on, resulting in charge sharing occurring between a data storage capacitor and a bit line capacitor. This charge sharing in turn results in a potential difference or gap ΔV being generated between a bit line BIT LINE and an inverted bit line BITB LINE. This potential difference is developed by a sensing operation of a bit line sense amplifier. Then, charges on the bit line BIT LINE and inverted bit line BITB LINE are transferred to outside of the DRAM cell over input/output lines lio, liob, gio and giob. This series of operations is collectively called the read operation.

Notably, a transistor has a characteristic that its threshold voltage is higher when temperature is lower. Owing to this characteristic, when the memory cell operates at low temperature, the cell transistor is turned on incompletely due to a raised threshold voltage thereof, leading to inadequate charge sharing between the data storage capacitor and the bit line capacitor. In otherwords, at low temperature, a potential barrier of the cell-transistor rises, so that a relatively small amount of charges is transferred from the data storage capacitor to the bit line capacitor. This results in a phenomenon that the potential difference ΔV between the bit line BIT LINE and the inverted bit line BITB LINE becomes small. When the bit line sense amplifier is operated under the condition that the potential difference ΔV between the bit line BIT LINE and the inverted bit line BITB LINE is formed to such a small degree, the bit line sense amplifier may fail to recognize the potential difference correctly, so that it may reversely develop the potentials of the bit line BIT LINE and inverted bit line BITB LINE, leading to a fail phenomenon that, for example, high-level data on the bit line is misrecognized as low-level data. This fail phenomenon in the low-temperature operation of the memory cell similarly occurs in the write operation.

BRIEF SUMMARY

In an aspect of the present disclosure, an internal voltage detection circuit comprises a first detect signal generator for generating a first detect signal to detect an operating level of an internal voltage corresponding to an operating temperature; a second detect signal generator for generating a second detect signal to detect a specific level of the internal voltage; and a detect signal clamp unit for generating a clamped detect signal in response to a first detect signal and a second detect signal.

The first detect signal generator may receive the internal voltage and generate the first detect signal, the first detect signal being enabled when the received internal voltage has the level corresponding to the operating temperature. Preferably, the detect signal clamp unit generates clamped detect signal depending on one of the level of the first detect signal and the second detect signal corresponding to an operating temperature.

The second detect signal generator may receive the internal voltage and generate the second detect signal, the second detect signal being enabled when the received internal voltage has the specific level corresponding to the preset temperature.

Preferably, the detect signal clamp unit generates clamped detect signal to prevent a level of the internal voltage from dropping below the specific level.

Preferably, the detect signal clamp unit for comparing a first level of the first detect signal and a second level of the second detect signal with each other and clamping the first detect signal according to a result of the comparison.

Preferably, the first detect signal generator comprises a pull-up device connected between a reference voltage terminal to which a reference voltage is applied and a output node, the pull-up device pulling the output node up in response to a ground voltage, and a pull-down device connected between the output node and an internal voltage terminal to which the internal voltage is applied, the pull-down device pulling the output node down in response to the reference voltage.

Preferably, the second detect signal generator comprises a pull-up device connected between a reference voltage terminal to which a reference voltage is applied and a output node, the pull-up device pulling the output node up in response to a ground voltage; and a pull-down device connected between the output node and a ground voltage terminal, the pull-down device pulling the output node down in response to the internal voltage.

Preferably, the detect signal clamp unit comprises a comparator for comparing the level of the first detect signal and the level of the second detect signal with each other to generate a clamping signal, and a pull-up device for pulling the first detect signal up in response to the clamping signal.

The comparator may generate the clamping signal, the clamping signal being enabled when the level of the first detect signal is lower than the level of the second detect signal.

The clamped first detect signal may detect the specific internal voltage level corresponding to the preset temperature when the operating temperature is above the preset temperature.

In another aspect of the present invention, an internal voltage generation device comprises an internal voltage detector for detecting a level of an internal voltage corresponding to an operating temperature of a memory cell and, when the operating temperature is above a preset temperature, generating a clamped detect signal to detect a specific level of the internal voltage corresponding to the preset temperature, and a voltage pump configured to receive the clamped detect signal and pump the internal voltage.

Preferably, the internal voltage detector comprises a first detect signal generator for generating a first detect signal to detect the internal voltage level corresponding to the operating temperature of the memory cell, a second detect signal generator for generating a second detect signal to detect the specific internal voltage level corresponding to the preset temperature, and a detect signal clamp unit for comparing a level of the first detect signal and a level of the second detect signal with each other and clamping the first detect signal according to a result of the comparison to generate the clamped detect signal.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF PREFERRED EMBODIMENTS

The present disclosure provides an internal voltage detection circuit which is capable of adjusting the level of a back bias voltage VBB supplied to a cell transistor to a temperature (referred to hereinafter as an 'operating temperature') at which a memory cell operates, and an internal voltage generation device using the same. That is, according to the present invention, when the operating temperature is low, the back bias voltage VBB is raised so as to lower the threshold voltage of the cell transistor, thus preventing occurrence of a fail phenomenon that data on a bit line is misrecognized. On the other hand, when the operating temperature is high, a phenomenon that off-leakage current of the cell transistor increases occurs. Therefore, according to the present invention, when the operating temperature is high, the back bias voltage VBB is lowered so as to raise the threshold voltage of the cell transistor, thereby reducing the off-leakage current of the cell transistor. As a result, it is possible to increase reliability of the memory cell.

On the other hand, when the operating temperature becomes excessively high (for example, above 100° C.), the back bias voltage VBB becomes excessively low, thus generating reverse drift current in a depletion region of the cell transistor. As result, charges in the memory cell are easily lost, resulting in a reduction in refresh time. Therefore, according to the present invention, when the operating temperature becomes excessively high (for example, above 100° C.), the back bias voltage VBB is constantly clamped to a level corresponding to a relatively low operating temperature, thereby preventing the charges in the memory cell from being lost due to the reverse drift current in the depletion region of the cell transistor.

Now, preferred embodiments of the present invention will be described in detail with reference to the annexed drawings. It should be noted that these embodiments are only for illustrative purposes and the scope of the invention and claims based on said invention is not limited thereto.

Figure 1:
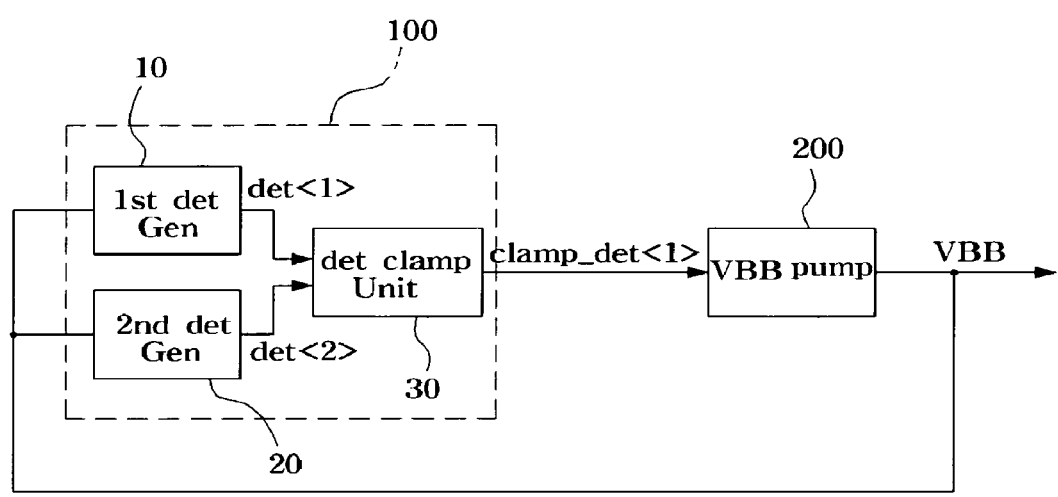
FIG. 1 is a block diagram showing the configuration of a back bias voltage VBB generation device according to an exemplary embodiment of the present invention.

FIG. 1 shows the configuration of a back bias voltage VBB generation device according to an exemplary embodiment of the present invention.

As shown in FIG. 1, the back bias voltage VBB generation device of the present embodiment comprises an internal voltage detector 100 for detecting a level of a back bias voltage VBB corresponding to an operating temperature and, when the operating temperature is above a preset temperature, generating a clamped detect signal clamp_det<1> to detect a specific level of the back bias voltage VBB corresponding to the preset temperature, and a voltage pump 200 configured to receive the clamped detect signal clamp_det<1> and pump the back bias voltage VBB.

The internal voltage detector 100 includes a first detect signal generator 10 for generating a first detect signal det<1> to detect the back bias voltage VBB level corresponding to the operating temperature, a second detect signal generator 20 for generating a second detect signal det<2> to detect the specific back bias voltage VBB level corresponding to the preset temperature, and a detect signal clamp unit 30 for comparing the level of the first detect signal det<1> and the level of the second detect signal det<2> with each other and clamping the first detect signal det<1> according to a result of the comparison to generate the clamped detect signal clamp_det<1>.

Figure 2:
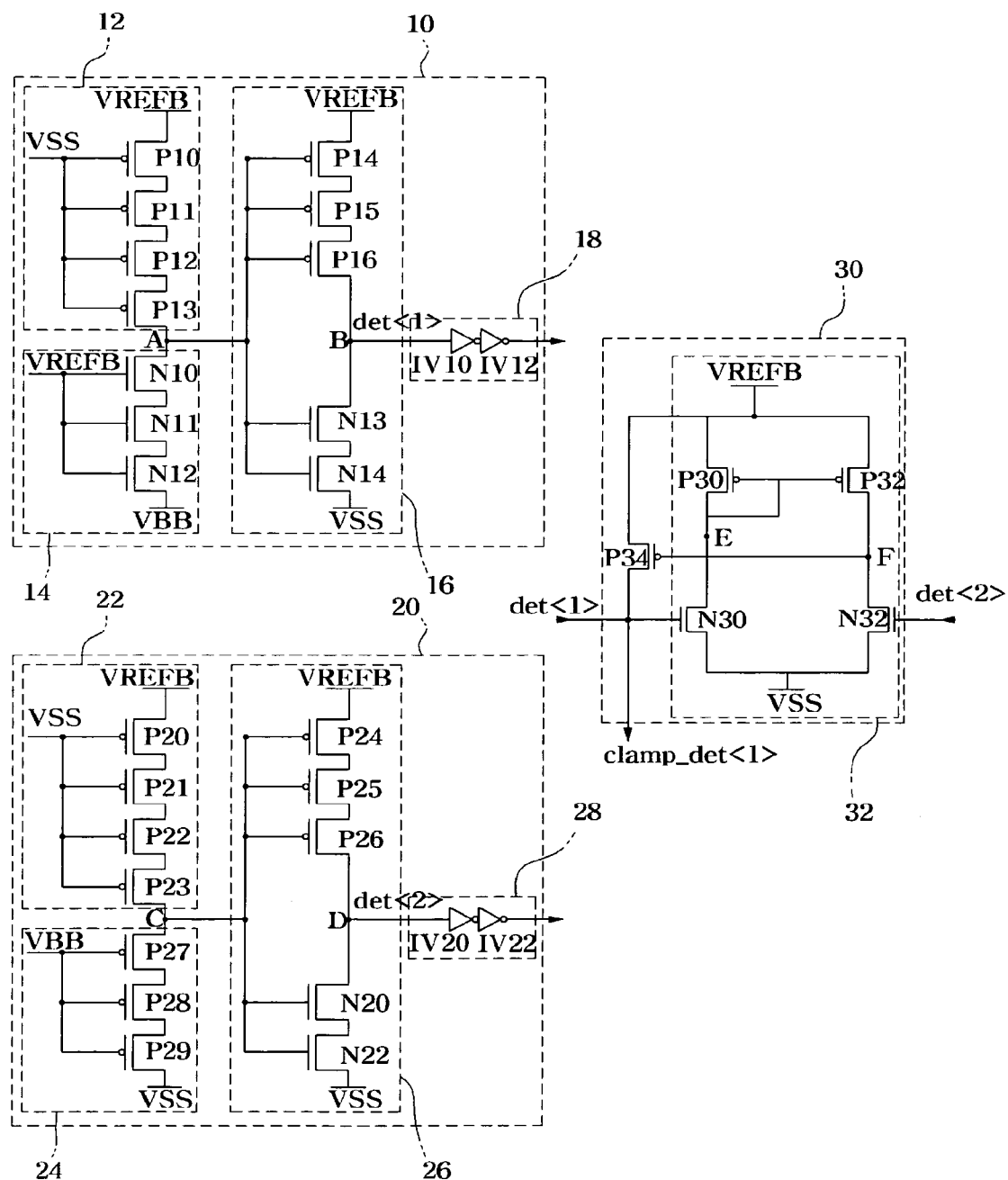
FIG. 2 is a detailed circuit diagram of an internal voltage detector shown in FIG. 1.

The first detect signal generator 10 includes, as shown in FIG. 2, a pull-up device 12 connected between a reference voltage terminal to which a reference voltage VREFB is applied and a node A. The pull-up device 12 pulls the node A up in response to a ground voltage VSS. To this end, the pull-up device 12 includes a plurality of p-channel metal oxide semiconductor (PMOS) transistors P10-P13. Here, the reason why the plurality of PMOS transistors P10-P13 are provided in the pull-up device 12 is to adjust a pull-up driving capability. The number of PMOS transistors may be different according to different embodiments.

The first detect signal generator 10 also includes a pull-down device 14 connected between the node A and a back bias voltage terminal to which the back bias voltage VBB is applied. The pull-down device 14 pulls the node A down in response to the reference voltage VREFB. To this end, the pull-down device 14 includes a plurality of n-channel metal oxide semiconductor (NMOS) transistors N10-N12. Here, the reason why the plurality of NMOS transistors N10-N12 are provided in the pull-down device 14 is to adjust a pull-down driving capability. The number of NMOS transistors may be different according to different embodiments. The first detect signal generator 10 further includes a buffer 16 for inverting-buffering a signal at the node A to generate the first detect signal det<1> at a node B. To this end, the buffer 16 includes a plurality of PMOS transistors P14-P16 and a plurality of NMOS transistors N13 and N14. The first detect signal generator 10 further includes a driver 18 for driving a signal at the node B. To this end, the driver 18 includes a plurality of inverters IV10 and IV12.

Figure 3:
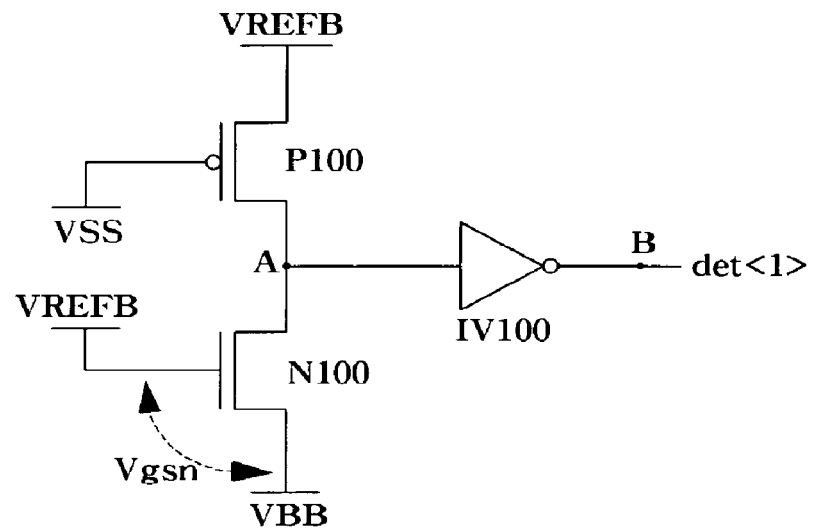
FIG. 3 is an equivalent circuit diagram of a first detect signal generator shown in FIG. 2.
Figure 4:
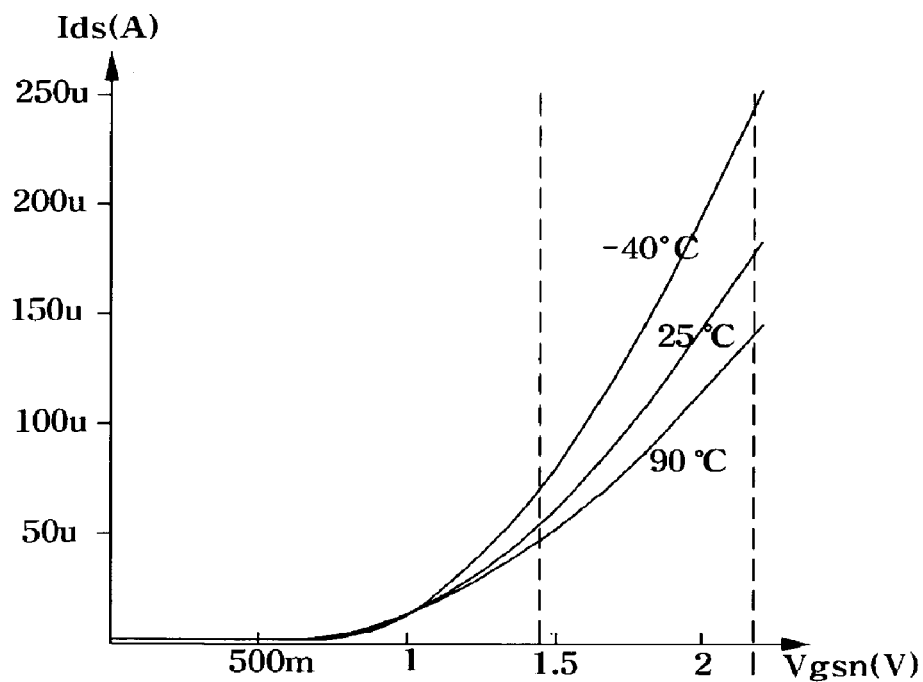
FIG. 4 is a waveform diagram showing operating temperature-to-turn-on current characteristics of an NMOS transistor shown in FIG. 3.

As shown in FIG. 3, the first detect signal generator 10 may be expressed by a simple equivalent circuit. That is, the pull-up device 12, pull-down device 14, and buffer 16 may be equivalently expressed by a PMOS transistor P100, NMOS transistor N100, and inverter IV100, respectively. The gate-source voltage Vgsn of the NMOS transistor N100 has a value of (reference voltage VREFB−back bias voltage VBB). Assuming that the reference voltage VREFB is set to 1.4V, the gate-source voltage Vgsn is 1.4V or more. Referring to FIG. 4, when the gate-source voltage Vgsn is 1.4V, the NMOS transistor N100 exhibits such characteristics that turn-on current Ids flowing through the NMOS transistor N100 has significant deviations with temperature. That is, when temperature is lower, a larger amount of turn-on current Ids is generated.

The operation of the first detect signal generator 10 with the above-stated configuration will hereinafter be described in detail with reference to FIGS. 3 to 6.

First, assume that the reference voltage VREFB is set to 1.4V and the target voltage of the back bias voltage VBB is set to −0.2V at an operating temperature of −40° C. When the reference voltage VREFB is inputted, the node A is pulled up to a high level, thereby causing the first detect signal det<1> to become low in level. When the inputted back bias voltage VBB does not approximate the target voltage, namely, it is higher than −0.2V, Vgsn<1.6V, so that charges, transferred to the node A through the PMOS transistor P100, cannot be adequately discharged through the NMOS transistor N100. As a result, the node A is maintained at a high level and the first detect signal det<1> is maintained at a low level. The gate-source voltage Vgsn capable of adequately discharging the charges at the node A may be set to different values according to different embodiments. In the present embodiment, in order to determine the size of the NMOS transistor N100 to adequately discharge the charges at the node A, the gate-source voltage Vgsn must be about 1.6V when the operating temperature is −40° C.

Thereafter, when the back bias voltage VBB approximates the target voltage, −0.2V, Vgsn=1.6V, so that charges, transferred to the node A through the PMOS transistor P100, are adequately discharged through the NMOS transistor N100. Accordingly, the node A makes a high-to-low level transition and the first detect signal det<1> makes a low-to-high level transition. In this manner, when the back bias voltage VBB approximates −0.2V, the first detect signal det<1> goes from a low level to a high level, so as to detect the target voltage of the back bias voltage at the operating temperature, −40° C.

Next, assume that the reference voltage VREFB is set to 1.4V and the target voltage of the back bias voltage VBB is set to −0.8V at an operating temperature of 90° C. When the reference voltage VREFB is inputted, the node A is pulled up to a high level, so that the first detect signal det<1> becomes low in level. When the inputted back bias voltage VBB does not approximate the target voltage, namely, it is higher than −0.8V, Vgsn<2.6V, so that charges, transferred to the node A through the PMOS transistor P100, cannot be adequately discharged through the NMOS transistor N100. As a result, the node A is maintained at a high level and the first detect signal det<1> is maintained at a low level. Referring to FIG. 4, the amount of turn-on current Ids when the operating temperature is 90° C. is smaller than that when the operating temperature is −40° C. For this reason, when the operating temperature is 90° C., the gate-source voltage Vgsn must be higher in order to more adequately discharge the charges. In the present embodiment, in order to determine the size of the NMOS transistor N100 to adequately discharge the charges at the node A, the gate-source voltage Vgsn must be about 2.2V when the operating temperature is 90° C.

Thereafter, when the back bias voltage VBB approximates the target voltage, −0.8V, Vgsn=2.2V, so that charges, transferred to the node A through the PMOS transistor P100, are adequately discharged through the NMOS transistor N100. Accordingly, the node A makes a high-to-low level transition and the first detect signal det<1> makes a low-to-high level transition. In this manner, when the back bias voltage VBB approximates −0.8V, the first detect signal det<1> goes from a low level to a high level, so as to detect the target voltage of the back bias voltage at the operating temperature, 90° C.

Figure 5:
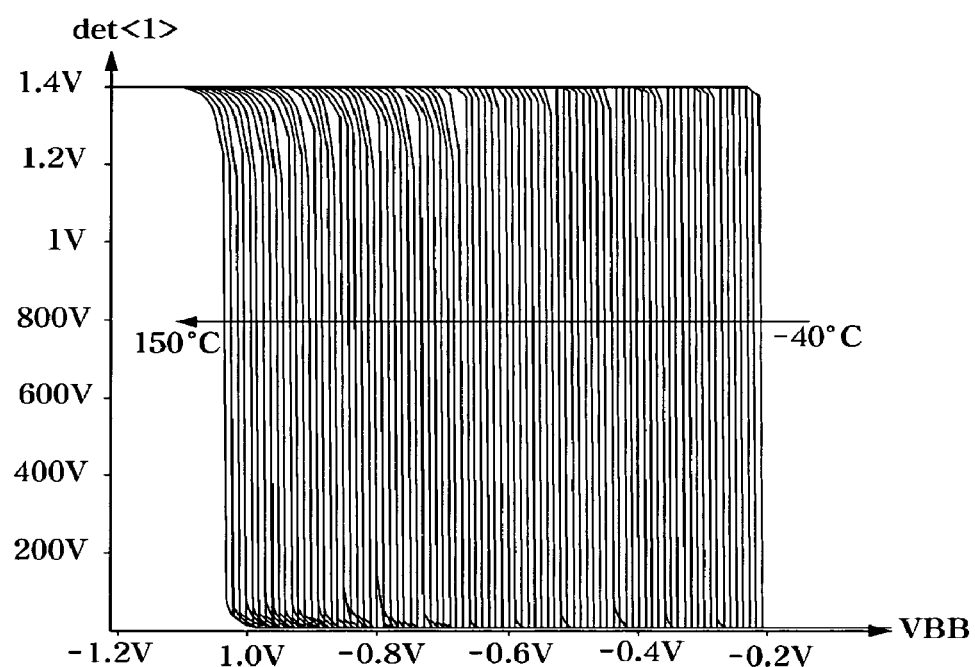
FIG. 5 is a simulation diagram showing operating temperature-to-simulation results of a first detect signal according to the exemplary embodiment of FIG. 3.
Figure 6:
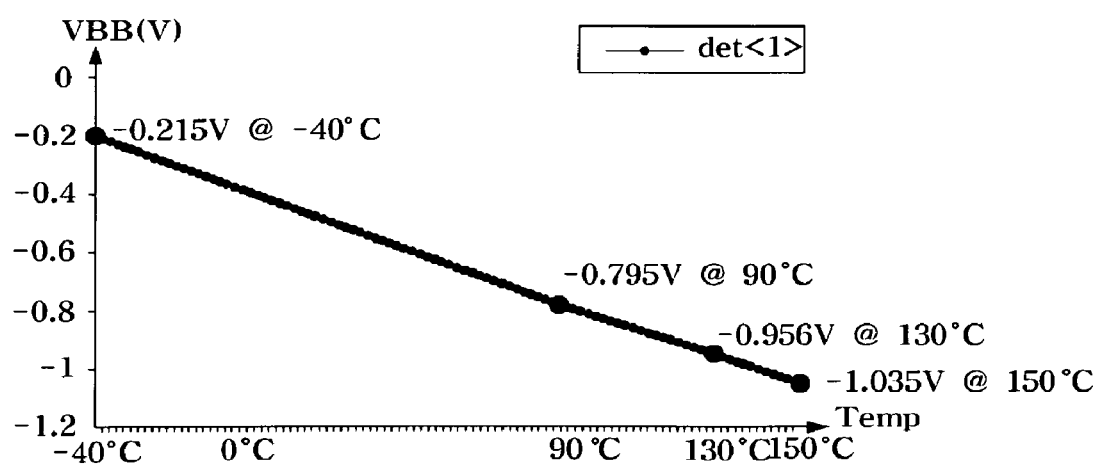
FIG. 6 is a graph showing internal voltage level variations by temperatures into which the simulation results of FIG. 5 are arranged.

Back bias voltage VBB levels at low-to-high level transitions of the first detect signal det<1> with respect to respective operating temperatures can be seen from FIG. 5. It can also be seen from FIG. 6 that the back bias voltage VBB level detected by the first detect signal det<1> gradually decreases as the operating temperature increases. That is, referring to FIGS. 5 and 6, a back bias voltage VBB level of −0.215V is detected at an operating temperature of −40° C., and a back bias voltage VBB level of −0.956V is detected at an operating temperature of 130° C.

The second detect signal generator 20 includes, as shown in FIG. 2, a pull-up device 22 connected between the reference voltage terminal to which the reference voltage VREFB is applied and a node C. The pull-up device 22 pulls the node C up in response to the ground voltage VSS. To this end, the pull-up device 22 includes a plurality of PMOS transistors P20-P23. Here, the reason why the plurality of PMOS transistors P20-P23 are provided in the pull-up device 22 is to adjust a pull-up driving capability. The number of PMOS transistors may be different according to different embodiments. The second detect signal generator 20 also includes a pull-down device 24 connected between the node C and a ground voltage terminal VSS. The pull-down device 24 pulls the node C down in response to the back bias voltage VBB. To this end, the pull-down device 24 includes a plurality of PMOS transistors P27-P29. Here, the reason why the plurality of PMOS transistors P27-P29 are provided in the pull-down device 24 is to adjust a pull-down driving capability. The number of PMOS transistors may be different according to different embodiments. The second detect signal generator 20 further includes a buffer 26 for inverting-buffering a signal at the node C to generate the second detect signal det<2> at a node D. To this end, the buffer 26 includes a plurality of PMOS transistors P24-P26 and a plurality of NMOS transistors N20 and N22. The second detect signal generator 20 further includes a driver 28 for driving a signal at the node D. To this end, the driver 28 includes a plurality of inverters IV20 and IV22.

Figure 7:
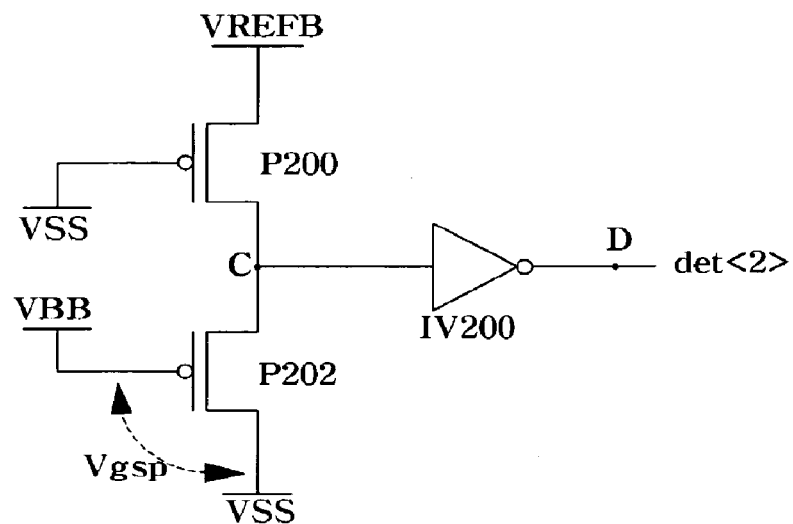
FIG. 7 is an equivalent circuit diagram of a second detect signal generator shown in FIG. 2.

As shown in FIG. 7, the second detect signal generator 20 may be expressed by a simple equivalent circuit. That is, the pull-up device 22, pull-down device 24, and buffer 26 may be equivalently expressed by a PMOS transistor P200, PMOS transistor P202, and inverter IV200, respectively. The gate-source voltage Vgsp of the PMOS transistor P202 has a value of (back bias voltage VBB−ground voltage VSS). The absolute value of the gate-source voltage Vgsp is equal to the absolute value of the back bias voltage VBB. Assuming that the back bias voltage VBB is within the range of 0V to about −1V with temperature, the gate-source voltage Vgsp of the PMOS transistor P202 is also within a range not exceeding about 1V.

Figure 8:
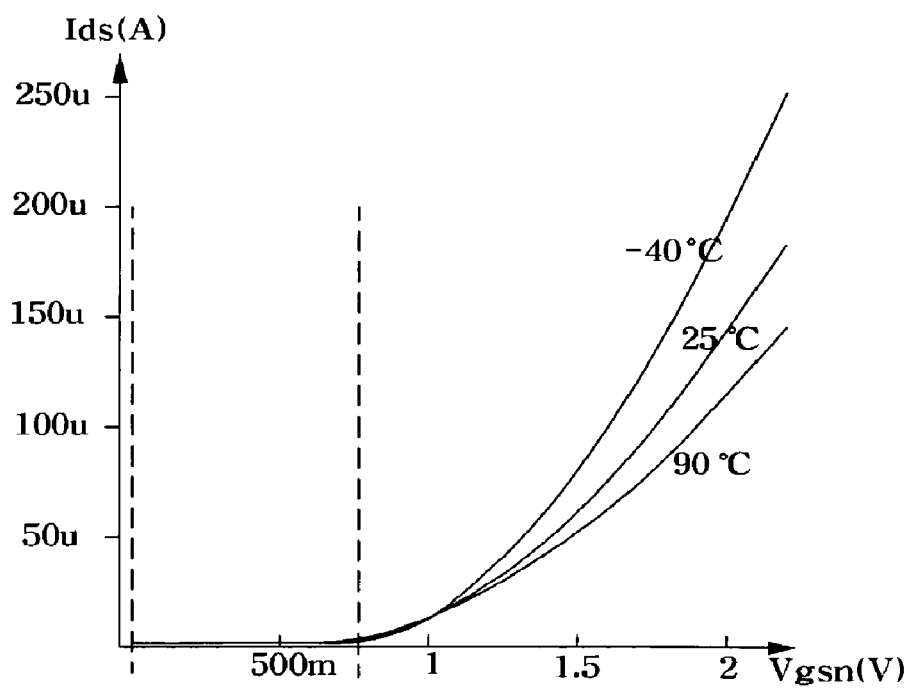
FIG. 8 is a waveform diagram showing operating temperature-to-turn-on current characteristics of a PMOS transistor shown in FIG. 7.

Referring to FIG. 8, when the gate-source voltage Vgsp is within a range not exceeding about 1V, the PMOS transistor P202 exhibits such characteristics that turn-on current Ids flowing through the PMOS transistor P202 has little deviations with temperature. That is, the amount of turn-on current Ids flowing through the PMOS transistor P202 is constant irrespective of temperature. In the present embodiment, the size of the PMOS transistor P202 is determined such that the PMOS transistor P202 can adequately discharge charges at the node C when the gate-source voltage Vgsp is 0.8V, namely, the back bias voltage VBB is −0.8V. As stated previously with reference to FIG. 6, the back bias voltage VBB level of −0.8V is a level that is detected by the first detect signal det<1> when the operating temperature is about 90° C. In the second detect signal generator 20 of the present embodiment, the preset temperature is given 90° C., which is the operating temperature corresponding to the back bias voltage VBB level of −0.8V.

The operation of the second detect signal generator 20 with the above-stated configuration will hereinafter be described in detail with reference to FIGS. 7 to 10.

First, assume that the reference voltage VREFB is set to 1.4V. When the reference voltage VREFB is inputted, the node C is pulled up to a high level, thereby causing the second detect signal det<2> to become low in level. When the inputted back bias voltage VBB does not approximate −0.8V irrespective of a target voltage based on temperature, namely, it is higher than −0.8V, Vgsp<0.8V, so that the PMOS transistor P202 cannot adequately discharge the charges at the node C, as stated previously. As a result, the node C is maintained at a high level and the second detect signal det<2> is maintained at a low level.

Thereafter, when the back bias voltage VBB approximates 0.8V, Vgsp=0.8V, so that the charges, transferred to the node C through the PMOS transistor P200, are adequately discharged through the PMOS transistor P202. As a result, the node C makes a high-to-low level transition and the second detect signal det<2> makes a low-to-high level transition. In this manner, when the back bias voltage VBB approximates −0.8V, the second detect signal det<2> goes from a low level to a high level, so as to detect −0.8V, which is the back bias voltage VBB level corresponding to the preset temperature, 90° C., irrespective of the operating temperature.

Figure 9:
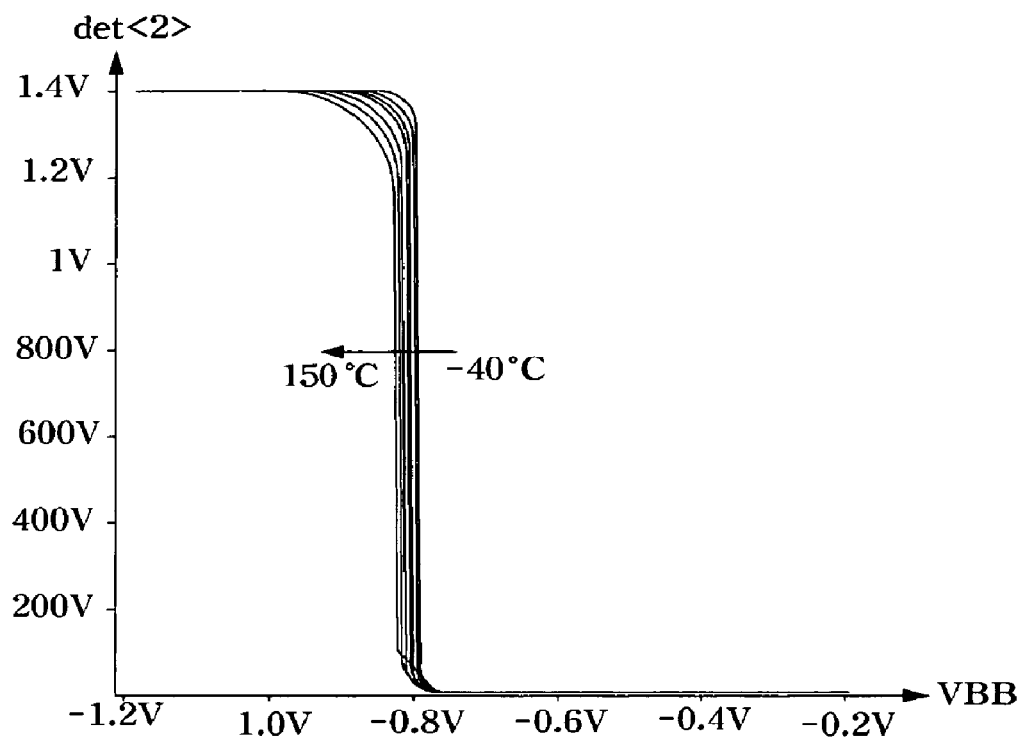
FIG. 9 is a simulation diagram showing operating temperature-to-simulation results of a second detect signal according to the exemplary embodiment of FIG. 7.
Figure 10:
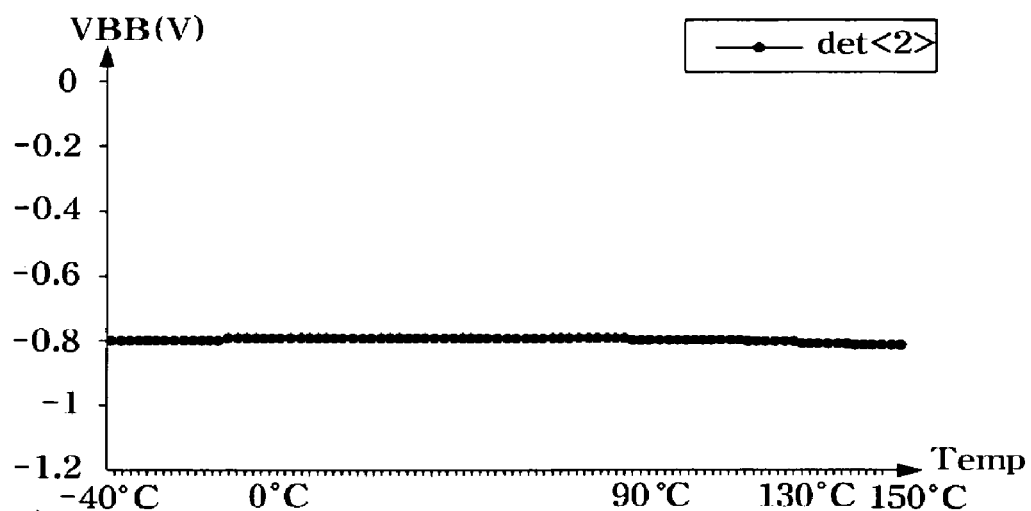
FIG. 10 is a graph showing internal voltage level variations by temperatures into which the simulation results of FIG. 9 are arranged.

Back bias voltage VBB levels at low-to-high level transitions of the second detect signal det<2> with respect to respective operating temperatures can be seen from FIG. 9. At this time, it can also be seen that the back bias voltage VBB level is about −0.8V irrespective of temperature. It can also be seen from FIG. 10 that the back bias voltage VBB level detected by the second detect signal det<2> is about −0.8V, which corresponds to the preset temperature, 90° C., irrespective of the operating temperature.

Figure 11:
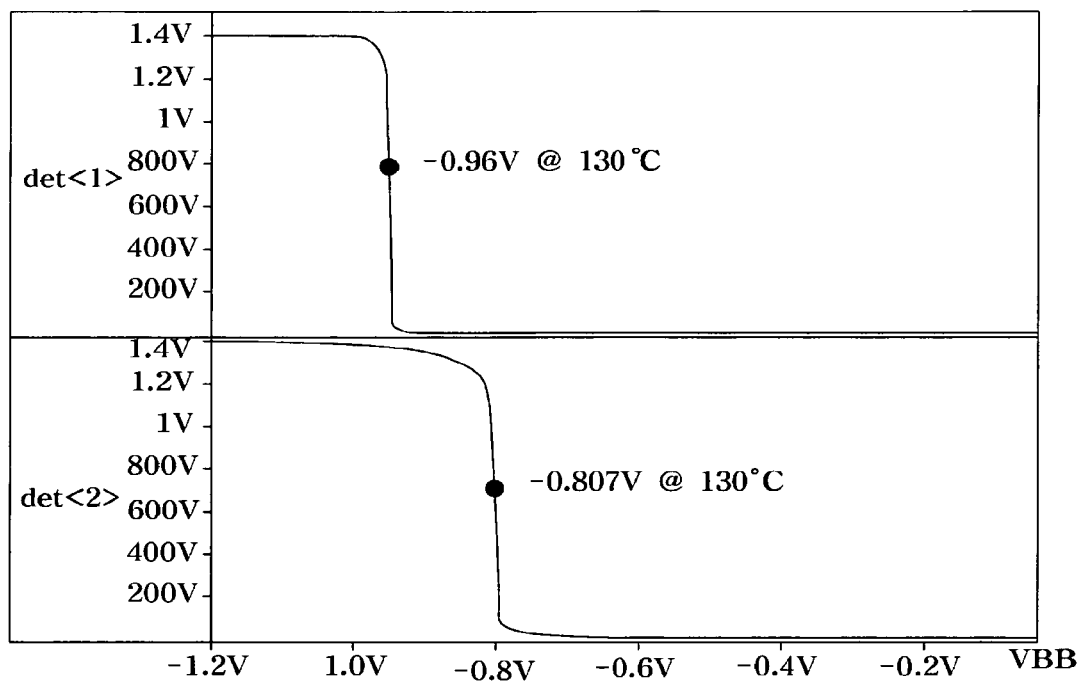
FIG. 11 is a simulation diagram showing simulation results of first and second detect signals generated by the internal voltage detector of FIG. 2 when an operating temperature is 130° C.

As can be seen from FIG. 11, where the operating temperature is 130° C., the first detect signal det<1> goes to a high level at the time that the back bias voltage VBB level approximates −0.96V, and the second detect signal det<2> goes to a high level at the time that the back bias voltage VBB level approximates −0.807V irrespective of the operating temperature.

Turning again to FIG. 2, the detect signal clamp unit 30 includes a comparator 32 including an NMOS transistor N30 configured to receive the first detect signal det<1>, an NMOS transistor N32 configured to receive the second detect signal det<2>, and a plurality of PMOS transistors P30 and P32 forming a current mirror. The detect signal clamp unit 30 further includes a PMOS transistor P34 for pulling the first detect signal det<1> up in response to a signal at a node F.

The detect signal clamp unit 30 with this configuration functions to generate the clamped detect signal clamp_det<1>. A process of generating the clamped detect signal clamp_det<1> will hereinafter be described in detail in conjunction with given examples.

First, where the operating temperature is lower than 90° C., the second detect signal det<2> is maintained at a low level even after the first detect signal det<1> goes to a high level, whereas the first detect signal det<1> goes to the high level at the time that the back bias voltage VBB level reaches a level (back bias voltage VBB level corresponding to the operating temperature) lower than −0.8V, as stated previously. Because the NMOS transistor N30 is turned on more strongly than the NMOS transistor N32 according to the level of the high-level first detect signal det<1>, the node F becomes high in level, thus turning off the PMOS transistor P34. Consequently, the clamped detect signal clamp_det<1> detects the back bias voltage VBB level in the same manner as the first detect signal det<1>. That is, the clamped detect signal clamp_det<1> detects the back bias voltage VBB level corresponding to the operating temperature.

On the other hand, where the operating temperature is higher than 90° C., the second detect signal det<2> goes to a high level at the time that the back bias voltage VBB level reaches −0.8V. In contrast, the first detect signal det<1> is maintained at a low level because it detects the back bias voltage VBB level lower than −0.8V. Because the NMOS transistor N32 is turned on more strongly than the NMOS transistor N30 according to the level of the high-level second detect signal det<2>, the node F becomes low in level, thus turning on the PMOS transistor P34. As a result, the PMOS transistor P34 pulls the first detect signal det<1> up to a high level, so as to generate the clamped detect signal clamp_det<1>, which makes a low-to-high level transition at the time that the back bias voltage VBB level reaches −0.8V. Consequently, where the operating temperature is higher than 90° C., the clamped detect signal clamp_det<1> detects −0.8V, which is a back bias voltage VBB level corresponding to 90° C. irrespective of the operating temperature.

Figure 12:
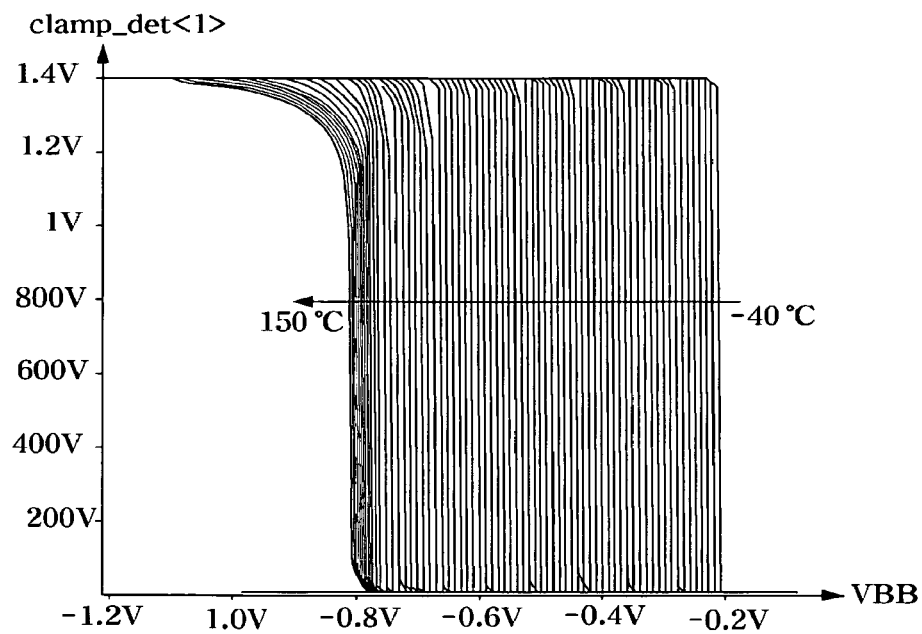
FIG. 12 is a simulation diagram showing operating temperature-to-simulation results of a clamped detect signal generated by a detect signal clamp unit shown in FIG. 2.
Figure 13:
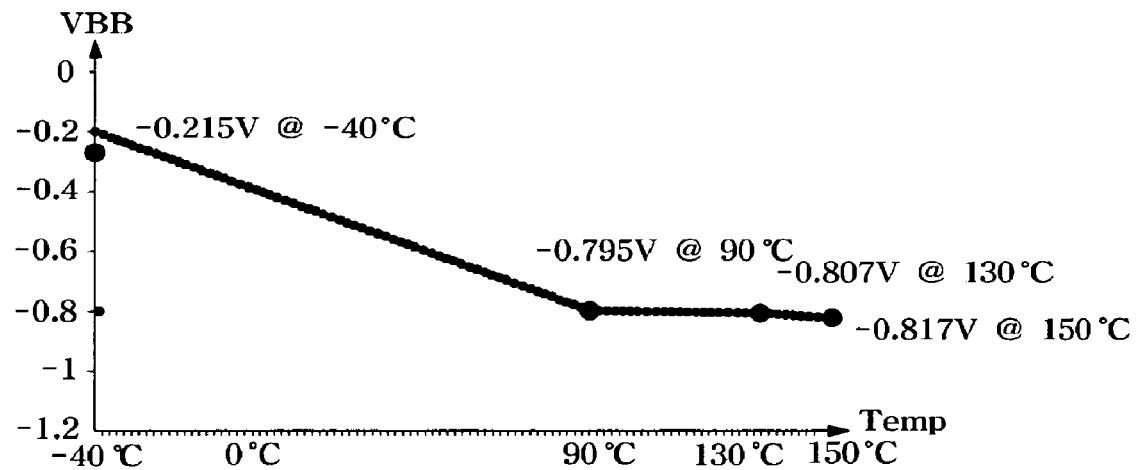
FIG. 13 is a graph showing internal voltage level variations by temperatures into which the simulation results of FIG. 12 are arranged.

As can be seen from FIG. 12, where the operating temperature is higher than 90C, the clamped detect signal clamp_det<1> detects a back bias voltage VBB level corresponding to about 90° C. irrespective of the operating temperature. That is, referring to FIG. 13, when the operating temperature is lower than 90° C., the clamped detect signal clamp_det<1> detects the same back bias voltage VBB level as that detected by the first detect signal det<1>. Conversely, when the operating temperature is higher than 90° C., the clamped detect signal clamp_det<1> is clamped to detect about −0.8V, which is a back bias voltage VBB level corresponding to the preset temperature of 90° C. irrespective of the operating temperature.

The voltage pump 200 receives the clamped detect signal clamp_det<1> and determines whether to pump the back bias voltage VBB. That is, the voltage pump 200 continues the pumping operation when the low-level clamped detect signal clamp_det<1> is inputted, and stops the pumping operation when the high-level clamped detect signal clamp_det<1> is inputted. In more detail, where the operating temperature is lower than 90° C., the voltage pump 200 continues the pumping operation until the back bias voltage VBB reaches a level corresponding to the operating temperature. For example, where the operating temperature is 40° C., the voltage pump 200 continues the pumping operation until the back bias voltage VBB reaches about −0.2V. Also, where the operating temperature is 90° C., the voltage pump 200 continues the pumping operation until the back bias voltage VBB reaches about −0.8V. On the other hand, where the operating temperature exceeds 90° C., the voltage pump 200 continues the pumping operation until the back bias voltage VBB reaches about 0.8V.

As apparent from the above description, according to the present invention, when the operating temperature is low, a back bias voltage VBB of a high level is generated so as to lower the threshold voltage of a cell transistor, thus preventing occurrence of a fail phenomenon that data on a bit line is misrecognized. Conversely, when the operating temperature is high, a back bias voltage VBB of a low level is generated so as to raise the threshold voltage of the cell transistor, thereby reducing the off-leakage current of the cell transistor. It is therefore possible to increase reliability of the memory cell. On the other hand, when the operating temperature becomes excessively high (above 90° C. in the present embodiment), a back bias voltage VBB is generated which is constantly clamped to a level corresponding to a preset temperature lower than the operating temperature. Therefore, it is possible to prevent the charges in the memory cell from being lost due to the reverse drift current in the depletion region of the cell transistor.

Although the internal voltage detection circuit and the internal voltage generation device using the same according to the present invention have been disclosed in connection with the generation of the back bias voltage VBB for illustrative purposes, it will be understood that the principle of the present invention is widely applicable to a variety of internal voltage generation devices for detecting internal voltage levels that are constantly clamped at a certain temperature or more.

Although the preferred embodiments of the present invention have been disclosed for illustrative purposes, those skilled in the art will appreciate that various modifications, additions and substitutions are possible, without departing from the scope and spirit of the disclosure and the accompanying claims.

This disclosure claims priority to Korean patent application number 10-2007-0016184, filed Feb. 15, 2007, the entire contents of which are incorporated herein by reference.

What is claimed is:

1. An internal voltage detection circuit comprising:
   a first detect signal generator for generating a first detect signal to detect an operating level of an internal voltage corresponding to an operating temperature;
   a second detect signal generator for generating a second detect signal to detect a specific level of the internal voltage; and
   a detect signal clamp unit for comparing a level of the first detect signal and a level of the second detect signal with each other, clamping the first detect signal according to a result of the comparison and generating a clamped detect signal.

2. The internal voltage detection circuit according to claim 1, wherein the detect signal clamp unit generates the clamped detect signal depending on one of the level of the first detect signal and the level of the second detect signal.

3. The internal voltage detection circuit according to claim 1, the detect signal clamp unit generates the clamped detect signal to prevent a level of the internal voltage from dropping below the specific level.

4. The internal voltage detection circuit according to claim 1, wherein the first detect signal generator receives the internal voltage and generates the first detect signal, the first detect signal being enabled when the received internal voltage has the operating level corresponding to the operating temperature.

5. The internal voltage detection circuit according to claim 1, wherein the first detect signal generator comprises:
   a pull-up device connected between a reference voltage terminal to which a reference voltage is applied and an output node, said pull-up device pulling the output node up in response to a ground voltage; and
   a pull-down device connected between the output node and an internal voltage terminal to which the internal voltage is applied, said pull-down device pulling the output node down in response to the reference voltage.

6. The internal voltage detection circuit according to claim 5, wherein the pull-up device comprises a p-channel metal oxide semiconductor (PMOS) transistor turned on in response to the ground voltage to supply the reference voltage to the output node.

7. The internal voltage detection circuit according to claim 5, wherein the pull-down device comprises an n-channel metal oxide semiconductor (NMOS) transistor turned on in response to the reference voltage to pull the output node down.

8. The internal voltage detection circuit according to claim 5, wherein the first detect signal generator further comprises a buffer for buffering a signal of the output node and generating the first detect signal.

9. The internal voltage detection circuit according to claim 1, wherein the second detect signal generator receives the internal voltage and generates the second detect signal, the second detect signal being enabled when the received internal voltage has the specific level.

10. The internal voltage detection circuit according to claim 1, wherein the second detect signal generator comprises:
    a pull-up device connected between a reference voltage terminal to which a reference voltage is applied and an output node, said pull-up device pulling the output node up in response to a ground voltage; and
    a pull-down device connected between the output node and a ground voltage terminal, said pull-down device pulling the output node down in response to the internal voltage.

11. The internal voltage detection circuit according to claim 10, wherein the pull-up device comprises a PMOS transistor turned on in response to the ground voltage to supply the reference voltage to the output node.

12. The internal voltage detection circuit according to claim 10, wherein the pull-down device comprises a PMOS transistor turned on in response to the internal voltage to pull the output node down.

13. The internal voltage detection circuit according to claim 10, wherein the second detect signal generator further comprises a buffer for buffering a signal of the output node and generating the second detect signal.

14. The internal voltage detection circuit according to claim 1, wherein the detect signal clamp unit comprises:
    a comparator for comparing the level of the first detect signal and the level of the second detect signal with each other and generating a clamping signal; and
    a pull-up device for clamping the first detect signal up in response to the clamping signal and generating the clamped detect signal.

15. The internal voltage detection circuit according to claim 14, wherein the clamping signal is enabled when the level of the first detect signal is lower than the level of the second detect signal.

16. The internal voltage detection circuit according to claim 1, wherein the internal voltage is a back bias voltage.

17. The internal voltage detection circuit according to claim 1, wherein the clamped detect signal detects the specific level of the internal voltage when the operating temperature is above a preset temperature.

18. An internal voltage generation device comprising:
an internal voltage detector comprising
a first detect signal generator for generating a first detect signal to detect an operating level of an internal voltage corresponding to an operating temperature,
a second detect signal generator for generating a second detect signal to detect a specific level of the internal voltage and a detect signal clamp unit for comparing a level of the first detect signal and
a level of the second detect signal with each other, clamping the first detect signal according to a result of the comparison and generating a clamped detect signal; and
a voltage pump configured to receive the clamped detect signal and determine whether to drive the internal voltage.

19. The internal voltage generation device according to claim 18, wherein the detect signal clamp unit generates the clamped detect signal depending on the levels of the first detect signal and the second detect signal.

20. The internal voltage generation device according to claim 18, the detect signal clamp unit generates the clamped detect signal to prevent a level of the internal voltage from dropping below the specific level.

21. The internal voltage generation device according to claim 18, wherein the first detect signal generator receives the internal voltage and generates the first detect signal, the first detect signal being enabled when the received internal voltage has the operating level corresponding to the operating temperature.

22. The internal voltage generation device according to claim 18, wherein the first detect signal generator comprises:
a pull-up device connected between a reference voltage terminal to which a reference voltage is applied and an output node, said pull-up device pulling the output node up in response to a ground voltage; and
a pull-down device connected between the output node and an internal voltage terminal to which the internal voltage is applied, said pull-down device pulling the output node down in response to the reference voltage.

23. The internal voltage generation device according to claim 22, wherein the pull-up device comprises a PMOS transistor turned on in response to the ground voltage to supply the reference voltage to the output node.

24. The internal voltage generation device according to claim 22, wherein the pull-down device comprises an NMOS transistor turned on in response to the reference voltage to pull the output node down.

25. The internal voltage generation device according to claim 22, wherein the first detect signal generator further comprises a buffer for buffering a signal of the output node and generating the first detect signal.

26. The internal voltage generation device according to claim 18, wherein the second detect signal generator receives the internal voltage and generates the second detect signal, the second detect signal being enabled when the received internal voltage has the specific level corresponding to a preset temperature.

27. The internal voltage generation device according to claim 18, wherein the second detect signal generator comprises:
a pull-up device connected between a reference voltage terminal to which a reference voltage is applied and an output node, said pull-up device pulling the output node up in response to a ground voltage; and
a pull-down device connected between the output node and a ground voltage terminal, said pull-down device pulling the output node down in response to the internal voltage.

28. The internal voltage generation device according to claim 27, wherein the pull-up device comprises a PMOS transistor turned on in response to the ground voltage to supply the reference voltage to the output node.

29. The internal voltage generation device according to claim 27, wherein the second detect signal generator further comprises a buffer for buffering a signal of the output node and generating the second detect signal.

30. The internal voltage generation device according to claim 18, wherein the detect signal clamp unit comprises:
a comparator for comparing the level of the first detect signal and the level of the second detect signal with each other and generating a clamping signal; and
a pull-up device for clamping the first detect signal up in response to the clamping signal and generating the clamped detect signal.

31. The internal voltage generation device according to claim 30, wherein the clamping signal is enabled when the level of the first detect signal is lower than the level of the second detect signal.

32. The internal voltage generation device according to claim 18, wherein the internal voltage is a back bias voltage.

33. The internal voltage generation device according to claim 18, wherein the voltage pump stops driving of the internal voltage when the clamped detect signal is enabled.

* * * * *